(12) United States Patent
Debord et al.

(10) Patent No.: US 6,932,617 B2
(45) Date of Patent: Aug. 23, 2005

(54) FRAGMENTED BACKPLANE SYSTEM FOR I/O APPLICATIONS

(75) Inventors: Pierre Debord, Tourrettes sur Loup (FR); Rene Glaise, Nice (FR); Claude Gomez, Antibes (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/958,890

(22) Filed: Oct. 5, 2004

(65) Prior Publication Data

US 2005/0042893 A1 Feb. 24, 2005

Related U.S. Application Data

(63) Continuation of application No. 10/152,757, filed on May 22, 2002, now Pat. No. 6,824,393.

(30) Foreign Application Priority Data

May 29, 2001 (FR) .......................................... 01 480044

(51) Int. Cl.⁷ .............................................. H01R 12/00
(52) U.S. Cl. ...................................... 439/65; 361/788
(58) Field of Search ................................ 361/788, 695, 361/687; 165/121, 126; 415/177, 178, 213.1, 214.1; 439/61, 62, 63, 64, 65

(56) References Cited

U.S. PATENT DOCUMENTS

| | | | |
|---|---|---|---|
| 2,951,184 A | 8/1960 | Wyma | 317/101 |
| 3,730,264 A | 5/1973 | Krylow et al. | 165/128 |
| 4,498,717 A | 2/1985 | Reimer | 439/61 |
| 4,838,798 A | 6/1989 | Evans et al. | 439/61 |
| 5,006,961 A * | 4/1991 | Monico | 361/788 |
| 5,211,565 A | 5/1993 | Krajewski et al. | 439/65 |
| 5,335,146 A | 8/1994 | Stucke | 361/785 |
| 5,740,378 A | 4/1998 | Rehl et al. | 395/283 |
| 5,812,797 A | 9/1998 | Crane, Jr. et al. | 395/306 |
| 5,827,074 A | 10/1998 | Gatti | 439/61 |
| 5,907,475 A | 5/1999 | Babinski et al. | 361/719 |
| 6,081,430 A | 6/2000 | LaRue | 361/788 |
| 6,253,266 B1 | 6/2001 | Ohanian | 710/102 |
| 6,344,975 B1 | 2/2002 | Gayle | 361/788 |
| 6,392,142 B1 | 5/2002 | Uzuka et al. | 174/52.1 |
| 6,517,375 B2 * | 2/2003 | MacLaren et al. | 439/489 |

* cited by examiner

Primary Examiner—Briggitte R. Hammond
(74) Attorney, Agent, or Firm—William N. Hogg

(57) ABSTRACT

A backplane system allowing a very large number of interconnections between high-connectivity printed circuit boards and a backplane is disclosed. The backplane is fragmented into a plurality of backplane parts that comprise connectors on their edges to mate connectors arranged on the high-connectivity printed circuit boards. These backplane parts may also include other connectors on their edges to couple to extension printed circuit boards requiring less interconnections or cables. Interposers can be used to link several backplane parts and provide enhanced air circulation.

7 Claims, 4 Drawing Sheets

FRAGMENTED BACKPLANE SYSTEM FOR I/O APPLICATIONS

CROSS REFERENCE TO RELATED APPLICATION

This application is a continuation of application Ser. No. 10/152,757, filed May 22, 2002 now U.S. Pat. No. 6,824,393.

FIELD OF THE INVENTION

The present invention relates generally to "backplanes" (a/k/a "mother boards") into which a plurality of individual printed circuit boards can be plugged, and more particularly to an improved backplane structure allowing a very large number of interconnections between the individual printed circuit boards and the backplane.

BACKGROUND OF THE INVENTION

As shown in FIGS. 1(a) and 1(b), most complex state-of-the-art electronic structures such as described above are manufactured by mounting individual components 100 on printed circuit boards 110, sometimes simply referred to as PCB=s (or cards). The components are interconnected on the PCB's to accomplish various desired functions. These are also appropriately connected to edge connectors 120 by means of which the individual PCB's can be plugged into mating connectors of a backplane (or mother board) 130, thus forming, when assembled, a complete electronic system. Those skilled in the art know how to partition the various subfunctions of an electronic system onto various individual PCB's. In a typical example, the memory of a computer processor which would be implemented on a first PCB 110, can also be partially contained on a separate PCB 140, and would possibly be expanded by plugging additional memory boards, such as 150, into extra slots 160 that have been made available in backplane 130. Although the above technique of plugging a plurality of spaced PCB's, each in parallel relationship to the others, and each perpendicular to the backplane, has been adopted to implement complex electronic systems, this is not accomplished without limitations and problems.

Actually, a major limitation of this conventional structure is that, since the connectors are located on the edge of the PCB's, there is a stringent practical upper limit 125 to the number of interconnections that can be achieved between each PCB and the backplane while maintaining the size of these to reasonable dimensions and keeping PCB's and backplane form factors (i.e., width to length ratios) within manufacturable ratios. Moreover, as advances in microelectronics allow chips to increase in speed with additional I/O's, PCB's and connectors are required to pass these higher density signals at faster edge rates. Especially, telecommunications and networking designers have requirements for PCB to PCB interconnects to perform at sub-nanosecond rise times and with even higher signal densities than conventional products (such as a processor and its memories mentioned above). Thus, high performance sophisticated connectors must be used in these types of applications, requiring that signals be propagated on differential pairs with matched impedance and internal shielding to prevent signal cross-talk. Therefore, connector density becomes a constraint in such backplane system designs. State-of-the-art connectors are able to pass signals having sub-nanosecond rise times, e.g., rise times expressed in tenths of picoseconds. The two connections required by each single signal pair and the numerous ground connections needed to prevent cross-talk must be taken into consideration, to accommodate simultaneous switching and, generally speaking, to allow good signal propagation. Without increasing the size of backplanes and PCB's beyond a reasonable size, the number of signals that can span on the edge 125 of a PCB, plugged in a conventional backplane 130, must stay well below 1,000 since, over 12 inches (a reasonable size), a maximum of 500 to 840 signals can be handled according to the above stated connector density.

To stay current with an explosive demand for bandwidth, fueled by progresses in fiber and optoelectronic devices, such as DWDM (Dense Wavelength Division Multiplexing), the telecommunications and networking industries are developing network switches. These are mainly geared at allowing the deployment of a faster Internet that would meet the level of performance expected by mature business applications. Irrespective of the protocols in use (in practice, IP or Internet Protocol, tend to be the dominant protocol though), those products must be capable of sustaining the dispatching of traffic entering a network node through ingress ports, to appropriate egress ports, so that all types of individual communications are moved towards their final destination. One common platform in this industry is as shown in FIG. 1(b) and includes a single shelf 170 typically comprised of many, e.g., 16, port adapters 175 with a switch fabric in the center 180, thus following the traditional model hereinabove discussed. Because the carriers (e.g., the telephone companies, the service providers and the like) require the fabric to be fully redundant, there are both active and back-up switch cards 181 and 182, respectively. Port cards must typically be equipped today, each with optics at up to OC-192 (10 gigabits/sec.) to match the expected level of performance at a network node. Therefore, these feed 10 gigabits/sec. of IN and OUT traffic to both switch cards. Thus, as much as 16×10 gigabits/sec.×2=320 gigabits/sec. of switching bandwidth must be carried on the backplane, through the switch connectors to/from the port adapters. Moving hundreds of gigabits/sec. of bandwidth, and soon terabits, requires numerous high-speed serial lines to interconnect the components. Depending on the speed of these lines (each in the gigabits/sec. range), hundreds of such lines, if not thousands, are required on the backplane and through the connectors of the switch cards to meet the overall bandwidth requirement. Thus, exhausting or exceeding the I/O connection capability of the switch cards is possible when the number of ports to be implemented is higher than the one of this particular example (32×32 or 64×64 port switch are also common requirements) or if the port adapters must be upgraded to the next level of the optical carrier hierarchy, with four times faster optics, i.e., OC-768 at 40 gigabits/sec. Thus, when aggregate throughput has to be expressed in terabits/sec., the standard backplane solution of FIG. 1(b) just cannot accommodate the very large number of high speed serial I/O that are required to match the overall bandwidth of the switch core 180.

SUMMARY OF THE INVENTION

Thus, it is a broad object of the invention to disclose a backplane structure aimed at enabling a very large number of high speed interconnections between selected printed circuit boards, thus suitable for implementing I/O intensive electronic systems in general and, more specifically, terabit-class switch fabrics as discussed hereinabove.

It is yet another object of the invention that the backplane structure of the invention be an all-passive backplane.

It is a further object of the invention that it is mechanically feasible to plug and unplug any of the individual printed circuit boards, populated with active electronic devices, without requiring to shut down the whole electronic system, thus allowing its hot maintenance and continuous operation and availability.

It is still a further object of the invention that the electronic devices populating the printed circuit boards be easily coolable through the use of standard fans and blower devices.

It is yet a further object of the invention that not all fragments neither need to be exactly alike nor are required to be all present, thus allowing upgrading and customization of an electronic system to various environments and type of applications.

The accomplishment of these and other related objects is achieved by a backplane system for electrically connecting at least one high-connectivity printed circuit board having a plurality of first connectors thereon to a backplane structure wherein said backplane structure is comprised of a plurality of fragmented parts, each of said fragmented parts including at least one connector positioned on one of its edges and adapted for electrically connecting to a respective one of said first connectors of said at least one high-connectivity printed circuit board.

Further objects, features and advantages of the present invention will become apparent to one skilled in the art upon examination of the following description in reference to the accompanying drawings. It is intended that any additional advantages be incorporated herein.

DESCRIPTION OF THE PREFERRED EMBODIMENTS

For a better understanding of the present invention, together with other and further objects, advantages and capabilities thereof, reference is made to the following disclosure and appended claims in connection with the above-described drawings. It is understood that like numerals may be used to indicate like elements from figure to figure.

Figure 1A:
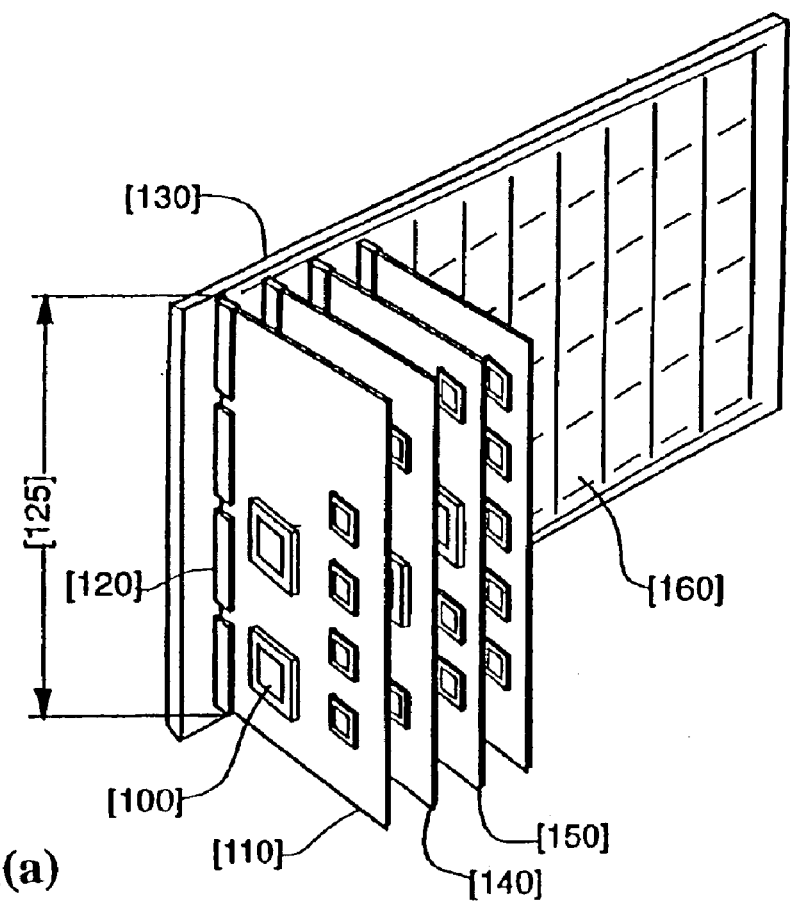
FIGS. 1(a) and 1(b) show examples of conventional packaging of electronic systems.
Figure 1B:
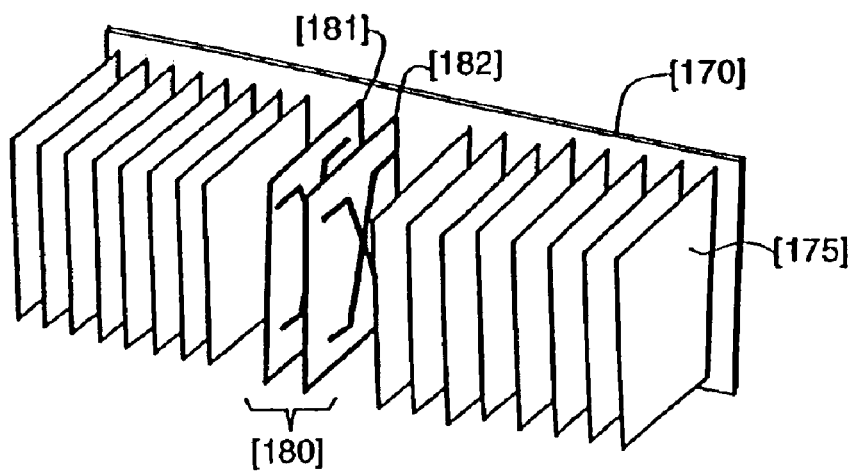
Figure 2:
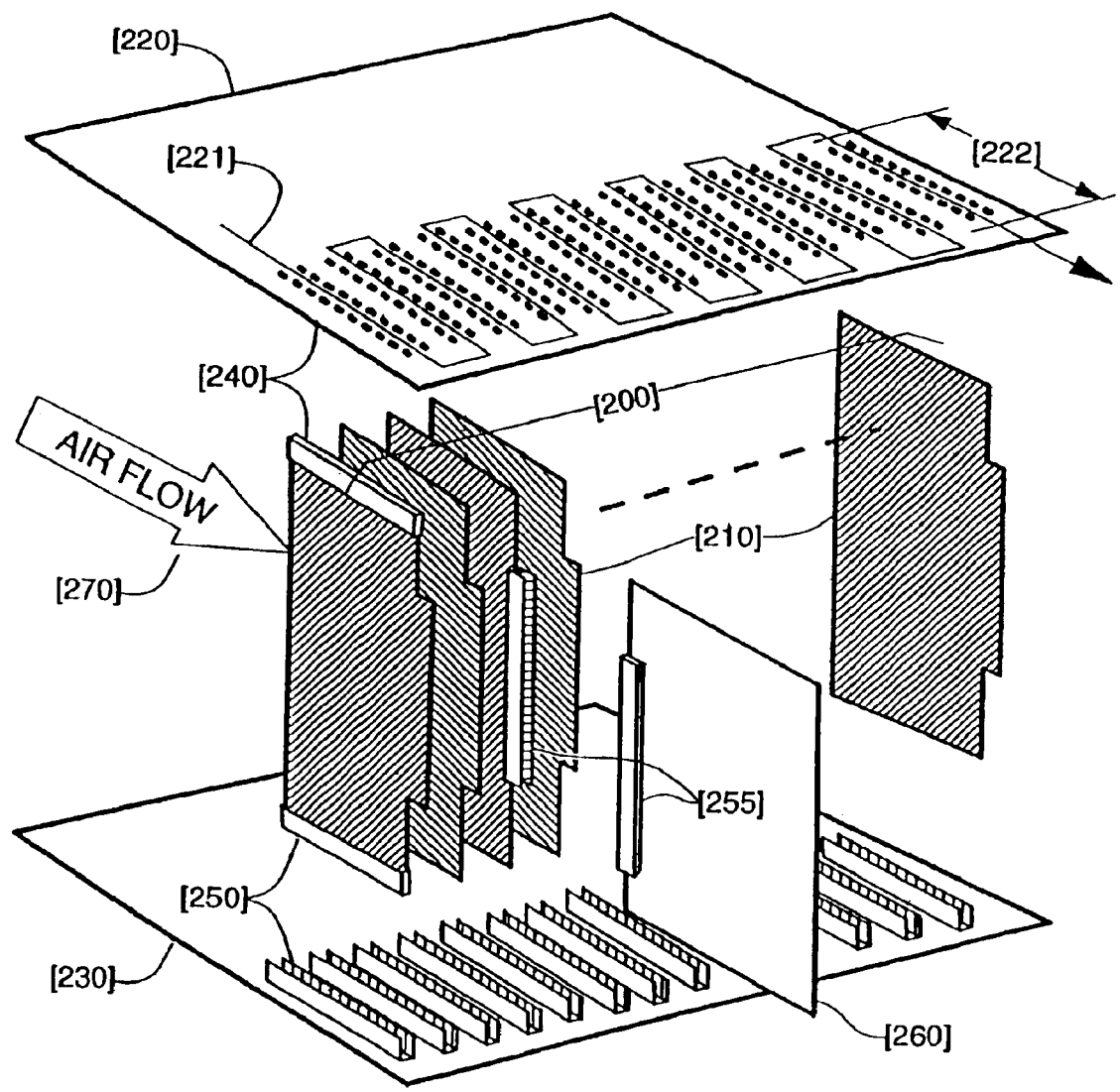
FIG. 2 depicts a fragmented backplane system according to one embodiment of the invention.

FIG. 2 shows the principle of a fragmented backplane according to one embodiment of the invention. In FIG. 2, an assembly 200 of multiple backplane fragments (pieces) 210 are used. Although not shown, the fragments can be mechanically joined together, e.g., with standard techniques to assemble printed circuit boards/backplanes currently known in the packaging of electronic systems. In FIG. 2, an upper PCB 220 and a lower PCB 230 can be connected to all fragments, respectively, through top and bottom connectors 240 and 250, respectively. That is, each fragment connector 240 (located on the fragment's edge in FIG. 2) is adapted for being electrically connected to a respective connector on PCB 220. Thus, if eight fragments are to be connected, a total of eight receiving, corresponding connectors would be located in the proper spaced-apart orientation on the underside of PCB 220. The upper and lower PCB's 220 and 230 are thus aimed at implementing the electronic functions that must concentrate the largest number of connections with other extension PCB's, such as 260. The lower and upper PCB's are preferably high-connectivity PCB's such as those used to implement the switch fabrics (active and backup ones) shown in FIG. 1(b) and discussed in the background section. More generally, the part of any electronic system that requires several connections can be implemented on these. Similarly, the extension, high-connectivity PCB 260 can be used to implement one switch port access function previously discussed or any part of an electronic system less demanding in number of I/O's. In one example, there could be 16 port adapters, each implemented on an extension PCB 260 and sufficient backplane fragments 210 to mate these. Backplane fragments are designed to be also connectable through standard connectors 255, to the extension, high-connectivity PCB's 260, which can, therefore, have access to both upper 220 and lower 230 PCB's through their corresponding fragments of the backplane.

The objective of obtaining many more I/O's is achievable since the connectors now placed side by side allow a much longer length of connection with the fragmented backplane (fragments 210), as sketched by the serpentine line 221, while keeping the size and form factors of the PCB's within manufacturable limits. Indeed, if connectors are, e.g., 2.5-inch wide (see dimension 222) and if the backplane is comprised of 16 fragments to connect 16 port adapters, then a connection length of 16×2.5=40 inches becomes available. This is more than three times what was estimated as reasonable in the discussion of the background section, thus allowing a much greater number of connections. Using the same connector density as in the background section, i.e., 50 to 70 per inch, 2000 to 2800 connections can thus be achieved, a significant increase.

It is worth noting that the mechanical assembly of FIG. 2 offers no obstacle to the circulation of air (see numeral 270) so the various electronic devices located on the upper and lower PCB's 220 and 230, as well as those on the extension PCB's 260, can be efficiently cooled. This is an important factor to consider for terabit-class switches and other high performance electronic systems which tend to use devices dissipating a lot of power when pushed to the maximum limits of the technology. In FIG. 2, fragments 210 are substantially parallel to one another and all are substantially perpendicular to both top and bottom PCB's 220 and 230. Air thus easily passes through the parallel fragments as shown.

FIGS. 3(a)–3(d) are drawings of various embodiments for the fragmented backplane according to the invention.

Figure 3A:
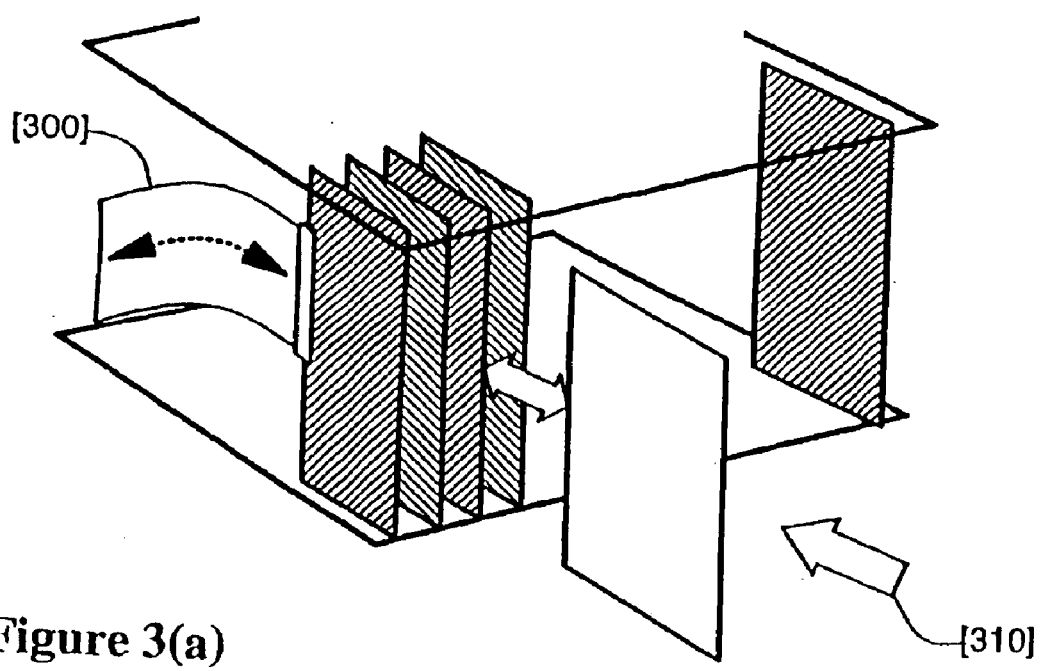
FIGS. 3(a)–3(d) illustrate various alternative examples of the invention.

FIG. 3(a) is intended to show that all sorts of cables 300 (flat cables, coaxial, twisted pairs and so on) can be attached on at least one side of the fragments (as shown) so as to improve system connectivity, if necessary. Such connectivity is also possible on the opposite side of the same fragment, as well as simultaneous connection on both sides at once. In the case specifically shown in FIG. 3(a), air flow (numeral 310) is preferably in the opposite direction as compared to previous FIG. 2 and still can efficiently cool all electronic devices located on the many PCB's.

Figure 3B:
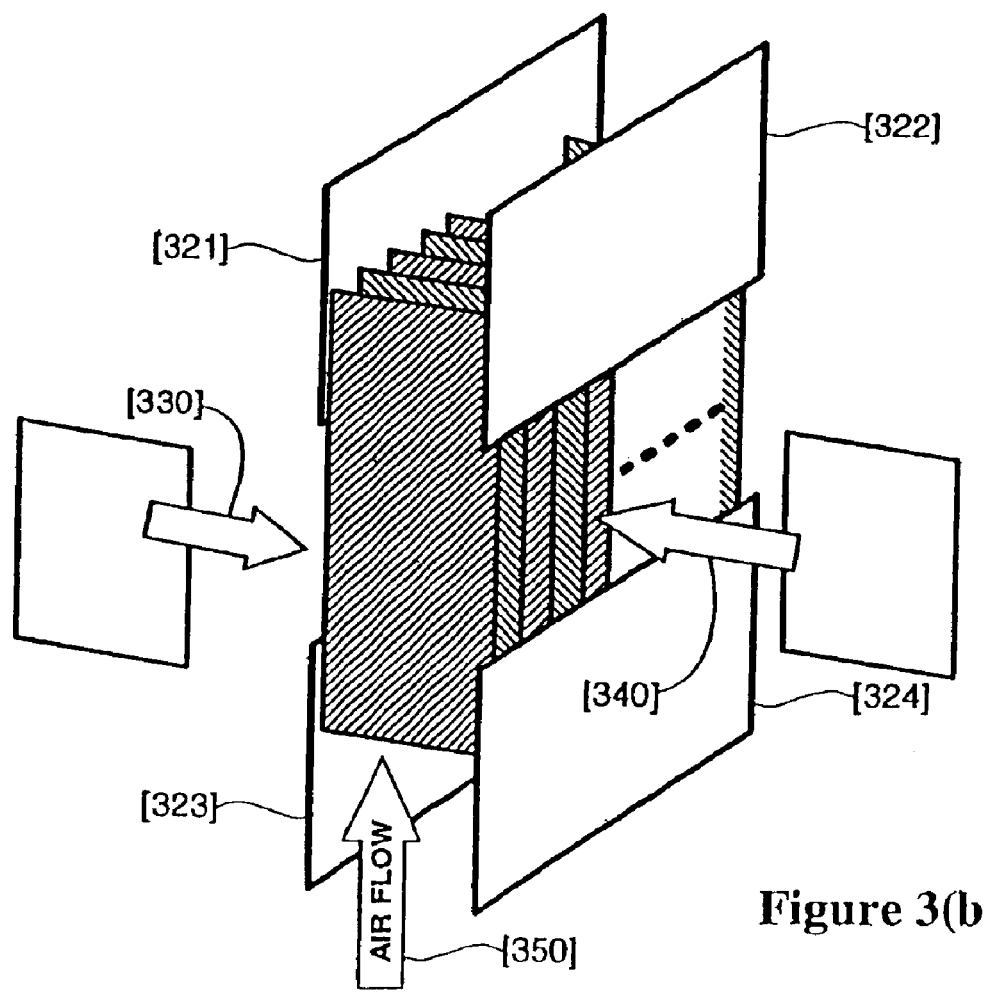

FIG. 3(b) shows that more than two high-connectivity PCB's can be accommodated by a fragmented backplane. Here, four such high connectivity PCB's 321, 322, 323 and 324 are interconnected while plugging of other extension PCB's and cables is still possible from left (PCB 330) and/or right side (PCB 340). Air can flow (see numeral 350) from bottom to top or, as well, from top to bottom. It is also worth noting that not all fragments need to have exactly the same structure. Depending on the type of right or left PCB (340 or 330, respectively) and/or connector that must be accommodated, a fragment can be better tailored for a particular application while still allowing, like all the other fragments, to connect to the high-connectivity PCB's, i.e., PCB 321 to PCB 324 in this particular example. This adds a great deal of flexibility to the invention. In this invention, not only the connectors to cables and extension PCB's can vary with each fragment, but the fragments themselves can be made from various PCB cross section structures, e.g., just a few or many wiring layers can be accommodated and the isolation material can be different. Lower speed adapters or a DC/DC converter, if any, may not need the expensive high frequency isolation material that is often required to implement multi-gigabit/sec. adapters. Moreover, fragments may be designed for using wiring and PCB technologies under development such as those which will include optical fiber wiring. That is, the fragmented backplane assembly taught herein does not require all fragments to be identical, but instead allows for more advanced backplane designs to be implemented when available in the future.

Figure 3C:
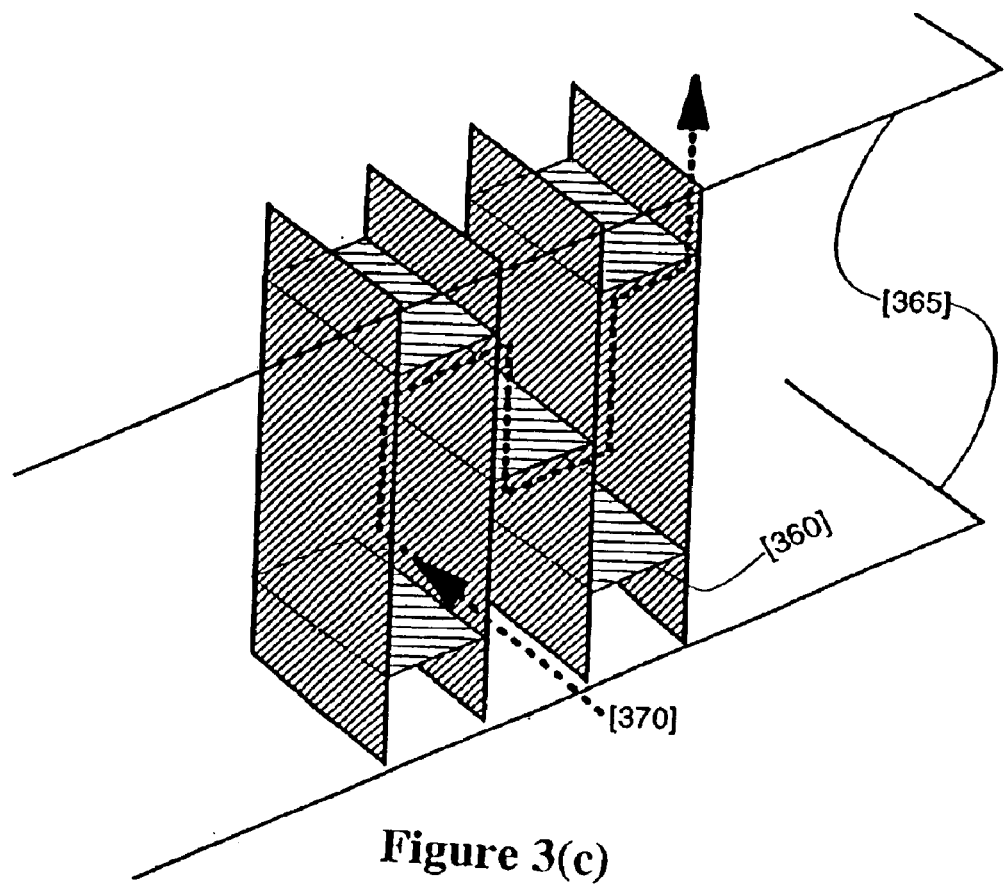

FIG. 3(c) shows another option of a fragmented backplane assembly which allows inter-fragment connections through interposers 360. This may be necessary if extension PCB to extension PCB communications are required and, more generally, if there are interconnections that do not need to go to the high-connectivity PCB's 365. Alternatively, a better access to a high-connectivity board could be provided in particular situations, such as illustrated by path 370. A typical example, in which inter-fragment connections would be useful, is a service bus that would need only to be distributed to all extension PCB's.

Figure 3D:
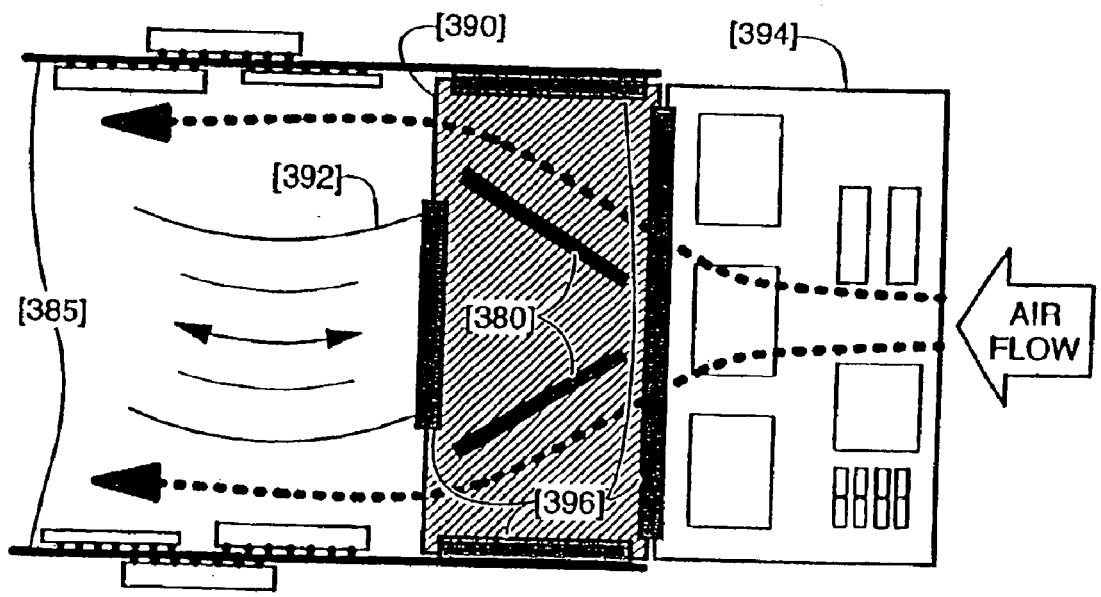

FIG. 3(d) is a section view of an example of a fragmented backplane assembly more particularly aimed at showing a particular arrangement of interposers 380 which serve two purposes. Firstly, these can be used as explained in FIG. 3(c) to carry signal connections between fragments 390 and, secondly, these interposers are oriented so that these are utilized as air deflectors in order to achieve a better cooling of the electronic components located on the upper and lower high-connectivity PCB's 385. In this particular example, a flat cable 392 is assumed to be connected on the left side of the fragment shown, i.e., 390, while, e.g., an extension PCB 394 is plugged from the right. Thus, fragment 390 is indeed equipped with connectors on its four sides 396 plus the two traversal connectors corresponding to the signal-carrying, coupling interposers 380.

While there have been shown and described what are at present the preferred embodiments of the invention, it will be obvious to those skilled in the art that various changes and modifications may be made therein without departing from the scope of the invention as defined by the appended claims.

What is claimed is:

1. A backplane system comprising at least one high-connectivity printed circuit board having a plurality of first connectors thereon electrically connected to a backplane structure wherein said backplane structure is comprised of a plurality of fragmented parts, each of said fragmented parts including at least one second connector positioned on one of its edges and electrically connecting to a respective one of said first connectors of said at least one high-connectivity printed circuit board; and including an extension printed circuit board for extending from one of said fragmented parts, and including a third connector, said fragmented part further including at least one fourth connector on one of its edges electically connecting to said third connector of said extension printed circuit board.

2. The backplane system of claim 1 wherein said extension printed circuit board is configured to be connected or unconnected from said fourth connector without shutting down the electronic system comprising said backplane system.

3. The backplane system of claim 1 further including an external cable wherein at least one of said fragmented parts further comprises at least one third connector being electrically connected to said external cable.

4. The backplane system of claim 1 wherein said high-connectivity printed circuit board and said fragmented parts of said backplane structure are arranged to facilitate air circulation through said backplane system.

5. The backplane system of claim 4 wherein each of said fragmented parts of said backplane structure are oriented substantially parallel to each other and substantially perpendicular to said high-connectivity printed circuit board.

6. The backplane system of claim 1 further comprising at least one interposer positioned on one of said fragmented parts configured for transmitting signals from said fragmented part to another of said fragmented parts.

7. The backplane system of claim 6 wherein said at least one interposer also is configured as an air deflector.

* * * * *